United States Patent [19]

Guterman et al.

[11] Patent Number: 4,545,035
[45] Date of Patent: Oct. 1, 1985

[54] DYNAMIC RAM WITH NONVOLATILE SHADOW MEMORY

[75] Inventors: Daniel C. Guterman, Plano; Ching-Lin Jiang, Dallas, both of Tex.

[73] Assignee: Mostek Corporation, Carrollton, Tex.

[21] Appl. No.: 400,171

[22] Filed: Jul. 20, 1982

[51] Int. Cl.⁴ .............................................. G11C 11/40
[52] U.S. Cl. .................................... 365/185; 365/182; 365/218
[58] Field of Search .................. 357/23 VT; 365/149, 365/174, 184, 185, 222, 182, 218

[56] References Cited

U.S. PATENT DOCUMENTS 4,331,968  5/1982  Gosney, Jr. et al. ................. 357/23

OTHER PUBLICATIONS

J. Drori et al., "A Single 5V Supply Nonvolatile Static RAM," ISSCC 81 Digest of Technical Papers, pp. 148-149, 1981.

Primary Examiner—Joseph A. Popek
Attorney, Agent, or Firm—Eric W. Petraske

[57] ABSTRACT

A compact memory cell combines a volatile dynamic storage section with a shadow nonvolatile section in two vertically stacked element arrays.

3 Claims, 3 Drawing Figures

DYNAMIC RAM WITH NONVOLATILE SHADOW MEMORY

DESCRIPTION

1. Technical Field

The field of the invention is that of semiconductor memories having nonvolatile storage.

2. Background Art

An article by J. Drori et al in the ISSCC 81 Digest of Technical Papers, pp 148 and 149 in the IEEE International Solid-State Circuits Conference 1981 illustrates in FIG. 2 a static RAM cell having nonvolatile shadow memory employing textured poly-silicon. This cell has a large size, approximately 10 square mils, and thus is limited in the number of cells per chip. U.S. Pat. No. 4,331,968 illustrates a nonvolatile memory element using avalanche injections as the charging mechanism. Avalanche injection requires high current with high voltage and its use prevents the development of a lower power, low voltage chip. It would be highly desirable if a volatile—nonvolatile cell could be developed that would permit the use of cell elements at high density and low power.

DISCLOSURE OF INVENTION

The invention relates to a dynamic RAM with a shadow memory comprising an array of five element memory cells combining a one transistor-one capacitor dynamic RAM cell with a three element nonvolatile cell including a vertically integrated nonvolatile storage element.

One feature of this invention is the use of a single node for both storage and recall coupling between volatile and nonvolatile cells.

Another feature of the invention is the use of a chip-wide bulk recall line to control recall and also to supply current for charging the volatile memory cells.

Another feature of the invention is the use of a vertically integrated dynamic memory element consisting of a dynamic storage capacitor disposed above the input transistor to the nonvolatile element.

Another feature of the invention is the use of both a sidewall capacitor, permitting a reduction in cell size, together with an ultra-thin tunnel oxide for a charging capacitor between the floating gate and the substrate, permitting the use of low current at the high voltage, in contrast with the prior art avalanche device.

BEST MODE FOR CARRYING OUT THE INVENTION

Figure 1:
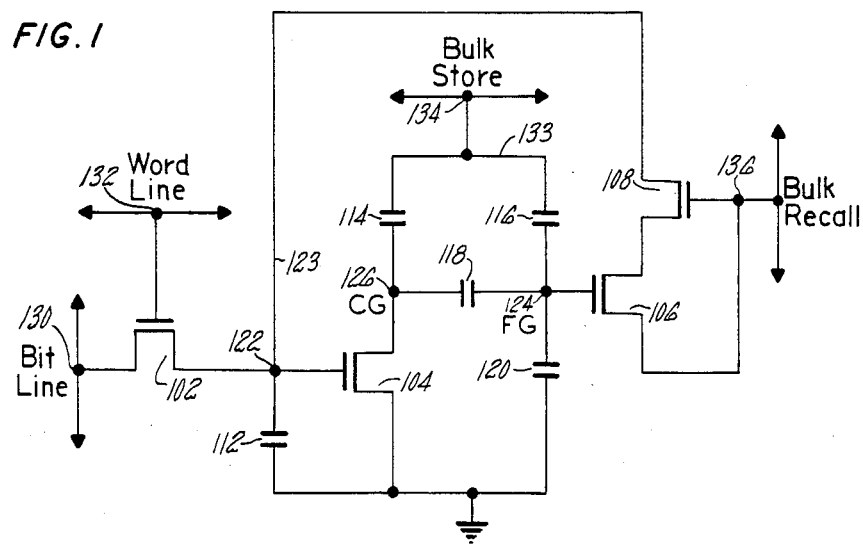
FIG. 1 illustrates a schematic diagram of a cell constructed according to the subject invention.

In FIG. 1, bit line 130 and word line 132 are part of a conventional array of address control lines for a dynamic RAM. Word line 132 controls input transistor 102 which permits the passage of binary data from bit line 130 into volatile storage node 122 which is the intersection of transistor 102 and storage capacitor 112, connected between volatile storage node 122 and ground. Transistor 102 and capacitor 112 together form a conventional one transistor-one capacitor dynamic RAM cell. Address decoding, input and refresh circuitry for the dynamic RAM cell are conventional and are omitted from the drawings for simplicity. Line 123, also connected to volatile storage node 122, comes from transistor 108 which is normally off so that the operation of the dynamic RAM cell is entirely conventional.

The total cell includes two elements, transistor 102 and capacitor 112, of the dynamic RAM cell and three other elements, input transistor 104, floating gate transistor 106 and recall transistor 108. In addition to conventional data and address lines as well as ground found in dynamic RAMs, there are bulk recall and bulk store which are common to all cells in the array. The result of this configuration of elements is a RAM cell with shadow memory having a total cell area of one and one-half square mils, compared with a total cell area of greater than 10 square mils in the prior art.

The prior art static shadow RAM uses a large volatile static cell together with a large nonvolatile element employing textured poly-silicon for enhanced tunneling. This large cell size of over 10 square mils prevents the device from being used for a large number of applications where density is essential.

The use of textured poly-silicon in the prior art device introduces further constraints associated with an exotic fabrication techniuqe.

In the nonvolatile portion of the cell, input transistor 104 is either on or off, depending on whether node 122 is a logical one (+5 volts) or zero (0 volts), and is used to control floating gate 124, the switching element of an insulated gate field effect transistor. Floating gate 124, in turn, controls output transistor 106 which is used to recall the data stored within the nonvolatile element. Floating gate 124 is capacitively coupled to other elements in the circuit by means of (a) capacitor 120 which is the capacitance between a thin-oxide portion of gate 124 and the N-doped substrate; (b) erase capacitor 116 which is formed between the edge of gate 124 and an outer layer of poly-silicon, as will be described later; and (c) coupling capacitor 118, which is the capacitance between gate 124 and control gate 126 which, in turn, is connected to the output of transistor 104. Control gate 126 is further coupled to bulk store line 134 by coupling capacitor 114.

The provision of shadow memory requires that there be a storage operation to transfer data from the volatile memory to the nonvolatile elements and a corresponding recall operation. These operations are effected by means of the bulk store and bulk recall lines, as will be described below.

During the storage operation, bulk store line 134 is increased from zero to approximately 20 volts, while word line 132 and bulk recall line 136 are all maintained at zero volts so that the data stored in volatile storage node 122 is not disturbed. If volatile storage node 122 is high (logical one) during the storage operation, transistor 104 will be held on the control gate 126 will be held at essentially ground. Capacitor 118 is designed to be considerably greater than capacitor 116, so that floating gate 124 is controlled primarily by control gate 126 and is capacitively coupled to a value close to ground so that the bulk of the voltage drop between bulk store line 134 and ground is across capacitor 116. Capacitor 116 is formed between an edge of floating gate 124 and a voltage electrode formed from the outer poly-silicon layer 133 connected to storage line 134, in particular at the point of closet approach near the side of this outer layer of poly-silicon. Insulation within capacitor 116 is formed by a silicon oxide layer of conventional thickness of approximately 750 angstroms. The geometrically enhanced high field gradient across this oxide layer causes electrons to pass from gate 124 to poly-silicon layer 133, removing any excess electrons that may be present and leaving a net positive charge on floating gate 124.

If volatile storage node 122 is low during the storage operation, transistor 104 will be off and control gate 126 will be raised to a high voltage by the large value of capacitor 114. Floating gate 124, because of the high capacitive coupling of capacitor 118 between the floating gate and the control gate, will also rise to some intermediate voltage value. In this case, the bulk of the voltage drop will be between gate 124 and ground capacitor 120, so that electrons will be drawn from ground to gate 124 neutralizing any positive charge which may remain from a previous store cycle and leaving gate 124 with a net negative charge.

Recall of nonvolatile data is controlled by bulk recall line 136 which combines with output transistor 106 and recall transistor 108 to transfer charge, under the control of the floating gate, to volatile storate node 122.

In order to recall information from nonvolatile store, the volatile storage nodes must all be at zero initially. This may be arranged simply by waiting until the voltage has decayed (as will be the case for a power failure) or, alternatively, by employing the input transistors 102 to drain any charge off the storage nodes. During the recall operation, word line 132 and bulk store line 134 are maintained at zero volts so that node 122 is isolated from bit line 130 and bulk recall line 136. Bulk recall line 136 is then pulsed to 5 volts and back to zero volts. If floating gate 124 is positive, output transistor 106 will be conducting and electrons will flow from volatile storage nodes 122 to bulk recall line 136 through output transistor 106 and recall transistor 108, so that a condition of net positive charge on floating gate 124 results in a logical one state on volatile storage node 122 and the data is recalled as noninverting. If transistors 106 and 108 each have thresholds of approximately one-half volt, the voltage at node 122 will be driven to a value of approximately 4 volts. The exact value will depend on the magnitude of the charge on gate 124 and on the transistor thresholds. Charge will not leak back from node 122 to bulk recall line 136 because transistor 108 will have its gate voltage equal to its source voltage and so will act like a diode. If floating gate 124 had a logical zero stored in it, output transistor 106 would be off, no current would flow through recall transistor 108, and volatile storage node 122 would remain in a logical zero state.

Since the nonvolatile element incorporates more components than the volatile portion of the cell, it is important to be careful with its layout. The dominant layout constraint is bulk store line 134 and the high voltage control gate node 126, because the twenty volts that is carried by them imposes special layout requirements to prevent breakdown through a diode or through a capacitor field plate and isolation punch through. An important feature of the cell configuration is that only one diffusion conductor (coupling the drain of transistor 104 to control gate 126) is exposed to high voltage.

In contrast to the prior art static shadow RAM, the use of a vertically stacked nonvolatile array permits the poly-silicon elements to be double duty, carrying current and also providing capacitive coupling. The use of tunnel oxide for charging the floating gate through capacitor 120, together with the sidewall oxide erase capacitor 116 permits a small, compact, low power arrangement that would not have been possible with the prior art nonvolatile avalanche injection element.

Figure 2:
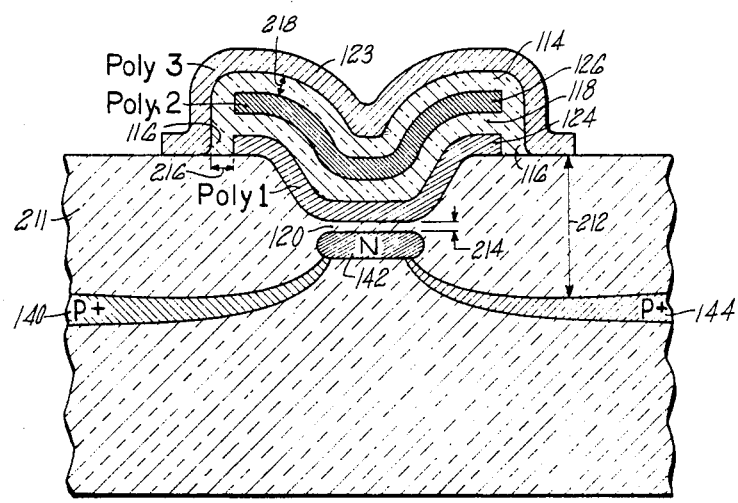
FIG. 2 illustrates in cross section one integrated circuit embodiment of the nonvolatile portion of the cell.

FIG. 2 illustrates in cross section a portion of the embodiment described in FIG. 1, illustrating the correlation between different layers of poly-silicon and the circuit elements which are formed by interaction of those layers. Floating gate 124 is a first layer of poly-silicon deposited on an oxide layer 211 attached to the substrate. A small portion of gate 124 has a thin oxide layer separated by a distance 214 of typically 125 angstroms from an N doped region of the substrate. Capacitor 120 is formed by the capacitance in that region. The remainder of gate 124 is separated from the substrate by a conventional oxide layer and is used to control output transistor 106. Control gate 126 is deposited above floating gate 124 and is arranged by a conventional self-aligning technique to have comparable area. The two gates are separated by a typical oxide layer of approximately 750 angstroms. The match in area between these two gates permits the formation of a large capacitance 118 which is used to provide the required strong capacitive coupling between the floating gate and the control gate at the expense of only a small area of the integrated circuit chip. A third layer of poly-silicon 133 is connected to bulk storage line 134 and covers both the floating gate and the control gate. This third layer of poly-silicon extends downward past the edges of gates 126 and 124 to form erase capacitor 116 having separation distance 216 between gate 124 and poly-silicon layer 133. This conveniently permits the same layer of poly-silicon to form the strong capacitive coupling of capacitor 114 between the control gate and the high voltage and also to maintain the small capacitance required of capacitor 116.

It is required that capacitors 120 and 116 be considerably smaller than capacitors 114 and 118 in order to produce the strong fields required for tunneling electrons. Capacitor 116 is kept small by reason of the small area exposed on the edge of gate 124 and capacitor 120 is kept small by requiring that the cross-sectional area of the portion of gate 124 having oxide distance 214 be quite small.

The vertical integration of the four capacitors 114, 116, 118 and 120 discussed above is not shown in the prior art avalanche nonvolatile element, since capacitor 114, between the outermost poly-silicon layer 133 and control gate 126 (of the second poly-silicon layer), does not appear as a circuit element—the only effect being a detrimental parasitic capacitance between the two layers of poly-silicon.

A second vertically integrated portion of the cell is the combination of transistor 104 with capacitor 112 to form a compact unit combining the dynamic storage capacitor with the input transistor to the nonvolatile element.

Figure 3:
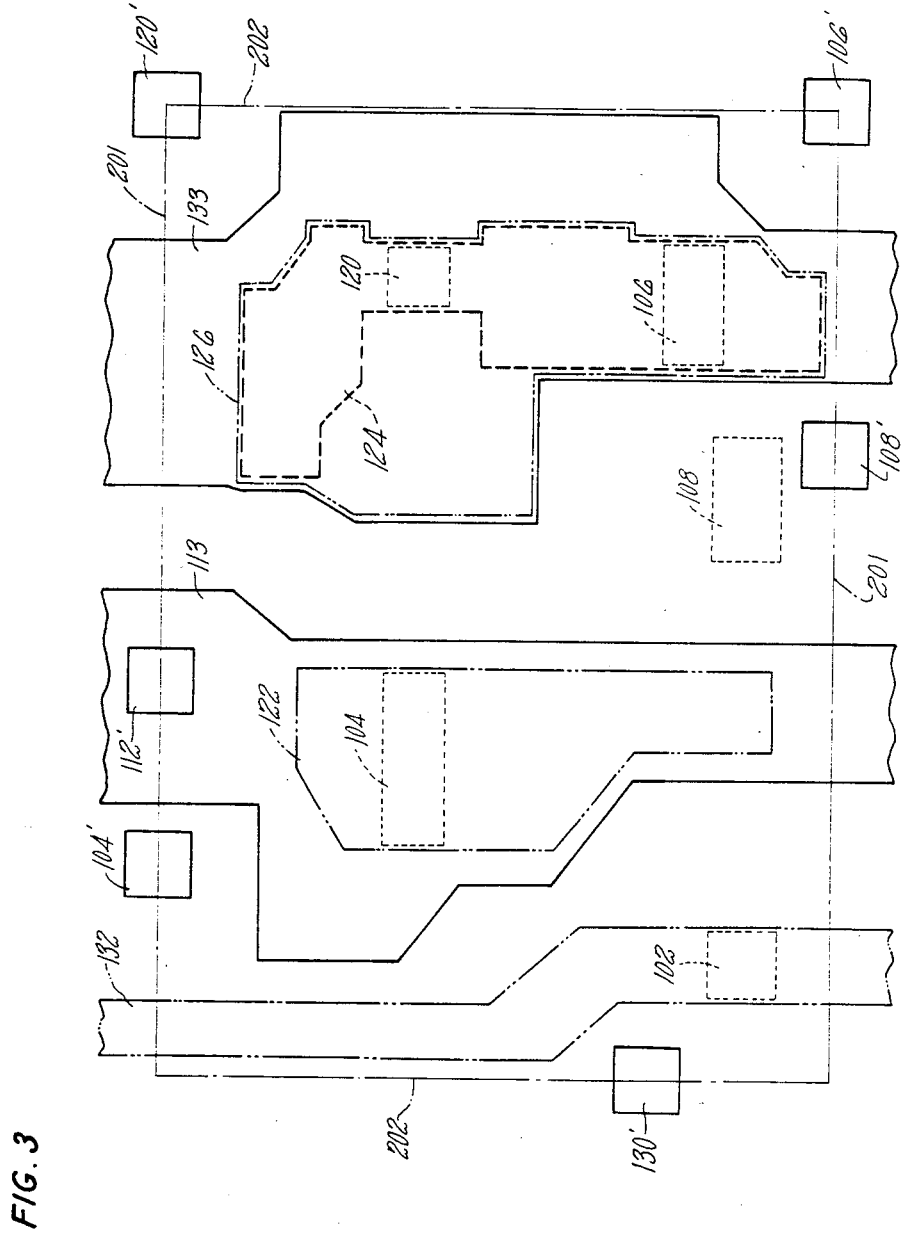
FIG. 3 illustrates portions of a layout of one embodiment of the cell.

The compactness of the layout that is provided by the vertical integration of different elements discussed above may be better appreciated by examination of FIG. 3, showing a portion of an individual memory cell. Some elements of the cell have been omitted for greater clarity in the drawing.

The nonvolatile portion of the cell occupies the right-hand portion of FIG. 3, including tunnel oxide capacitor 120, formed between the substrate and floating gate 124 (which is formed from a first layer of poly-silicon and shown in the drawing as a dashed line). Floating gate 124 extends to control output transistor 106. Control gate 126 is formed from a second layer of poly-silicon superimposed on floating gate 124, the edges of the two gates being self-aligned (edges that are superimposed have been shown as slightly offset for greater clarity). Control gate 126 is indicated by a phantom line with double dots. The outer layer of poly-silicon (voltage electrode 133) indicated by a solid line, extends past the cell boundaries to also form the bulk store line 134. The area of floating gate 124 (and hence of self-aligned control gate 126) is made large in order to dominate the tunnel oxide capacitor 120.

The dynamic storage capacitor-input transistor combination appears on the left side of the drawing showing transistor 104, with volatile node 122 (which is formed from the second layer of poly-silicon and also shown in a double-dot phantom line) extending over it. Element 113, formed from the third layer of poly-silicon, is the grounded plate of capacitor 112 and extends vertically in the figure to enter the adjacent cells.

Further compression in the area is obtained by sharing signal lines and metal contacts among cells. The metal contacts are indicated in FIG. 3 by primed numbers indicating the circuit element they serve. Contact 120' connects a ground line (not shown) that extends along top edge 201 of the basic cell. Contact 106' connects transistor 106 to bulk recall line 136 (not shown) that extends along the bottom edge of the basic cell. Contacts 120' and 106' are each shared by four cells. Contact 108' connects recall transistor 108 to bulk recall line 136. Contact 130' connects bit line 130 that extends parallel to bottom edge 201 of the basic cell (not shown) to transistor 102. Contacts 104' and 112' connect their respective elements to the same ground line that serves contact 120'. Contacts 108', 130', 104' and 112' are each shared by two cells. The basic cell is reflected about cell boundaries 201 and 202 in order to produce a cell array that uses the control lines efficiently.

The high voltage of bulk store line 134 may be supplied externally or may be generated by a conventional charge-pumping circuit on the chip.

Memory cells constructed according to the invention may be combined to form a RAM chip or may be combined with other memory and/or logic circuits. For example, the invention may be used to shadow registers in a CPU chip in order to preserve the state of the CPU during a power failure.

What is claimed is:

1. A nonvolatile random access memory cell comprising:

a data input transistor controlled by address control means for reading out and writing in binary data;

a volatile storage element, having at least one node for storing binary data;

a nonvolatile storage element having at least one floating gate disposed above a tunnel oxide capacitor and coupled to said at least one node of said volatile storage element;

means for transferring binary data from at least one of said at least one node to said nonvolatile storage element; and means for recalling binary data from said nonvolatile storage element to said volatile storage element, characterized in that:

said volatile storage element is a storage capacitor connected between a single volatile storage node at a terminal of said input transistor and ground;

said nonvolatile storage element includes a vertically stacked array of a floating gate disposed above said tunnel oxide capacitor and a floating gate transistor, a control gate, having at least one edge, disposed above said floating gate and capacitively coupled thereto with a first coupling capacitance, and a high voltage electrode for carrying high voltage in excess of 15 volts disposed above said control gate and extending in close proximity to said at least one edge, said voltage electrode being capacitively coupled to said control gate with a second coupling capacitance and capacitively coupled to said floating gate with an erase capacitance;

said means for transferring binary data includes a steering transistor connected between ground and said control gate and having a steering transistor gate connected to said volatile storage node; and said means for recalling binary data comprises a recall transistor, having a first terminal connected to said volatile storage node, a second terminal connected to a first terminal of said floating gate transistor and a recall gate connected to a recall terminal, which recall terminal is also connected to a second terminal of said floating gate transistor.

2. A memory cell according to claim 1, further characterized in that:

said storage capacitor is formed from a lower layer of poly-silicon that serves as said steering transistor gate and an upper layer of poly-silicon disposed above said lower layer of poly-silicon.

3. A memory cell according to either of claims 1 or 2, further characterized in that:

said high voltage electrode is capacitively coupled to a single diffusion conductor connecting said control gate and said steering transistor.

* * * * *